(12) United States Patent
Fujimoto et al.

(10) Patent No.: US 11,745,219 B2
(45) Date of Patent: Sep. 5, 2023

(54) VIBRATION APPARATUS (71) Applicant: Murata Manufacturing Co., Ltd., Nagaokakyo (JP)

(72) Inventors: Katsumi Fujimoto, Nagaokakyo (JP); Hitoshi Sakaguchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 609 days.

(21) Appl. No.: 17/015,923

(22) Filed: Sep. 9, 2020

(65) Prior Publication Data
US 2020/0406298 A1 Dec. 31, 2020

Related U.S. Application Data (63) Continuation of application No. PCT/JP2019/002545, filed on Jan. 25, 2019.

(30) Foreign Application Priority Data

Jun. 28, 2018 (JP) ................................ 2018-123352

(51) Int. Cl.
B06B 1/06 (2006.01)
B06B 1/02 (2006.01)
(Continued)

(52) U.S. Cl.
CPC .......... B06B 1/0655 (2013.01); B06B 1/0207 (2013.01); G02B 27/0006 (2013.01); G03B 17/02 (2013.01); H10N 30/204 (2023.02)

(58) Field of Classification Search
CPC ... B06B 1/0655; B06B 1/0207; B06B 1/0666; B06B 1/0651; G02B 27/0006; G03B 17/02; G03B 17/08; G03B 17/56; H10N 30/204
See application file for complete search history.

(56) References Cited

U.S. PATENT DOCUMENTS 11,237,387 B2 * 2/2022 Magee ............... G02B 27/0006
2014/0033454 A1 * 2/2014 Koops ................ G02B 27/0006
15/94
(Continued)

FOREIGN PATENT DOCUMENTS

JP 2012-138768 A 7/2012
WO 2011/078218 A1 6/2011
(Continued)

OTHER PUBLICATIONS

Official Communication issued in International Patent Application No. PCT/JP2019/002545, dated Mar. 12, 2019.

Primary Examiner — Luong T Nguyen
(74) Attorney, Agent, or Firm — KEATING & BENNETT, LLP (57) ABSTRACT A vibration apparatus includes a vibrating body that has a tubular shape and includes first and second opening end portions, an outside surface, and an inside surface, a light transmissive body connected to the second opening end portion of the vibrating body, and a piezoelectric vibrator provided in the vibrating body. The vibrating body includes a flange portion extending from the outside surface of the vibrating body toward an outside. The vibration apparatus further includes a driving circuit that vibrates a connection body of the light transmissive body and the vibrating body in a vibration mode of light transmissive body vibration or a vibration mode of flange portion vibration and that alternately switches between the vibration mode of the light transmissive body vibration and the vibration mode of the flange portion vibration.

20 Claims, 5 Drawing Sheets (51) Int. Cl.
  *G02B 27/00*   (2006.01)
  *G03B 17/02*   (2021.01)
  *H10N 30/20*   (2023.01)

(56) References Cited

U.S. PATENT DOCUMENTS

| | | |
|---|---|---|
| 2018/0095272 A1 | 4/2018 | Fujimoto et al. |
| 2018/0210194 A1* | 7/2018 | Nishiyama ............. G03B 17/08 |
| 2018/0239218 A1* | 8/2018 | Ikeuchi ................. G03B 17/08 |
| 2018/0292646 A1 | 10/2018 | Fujimoto et al. |
| 2019/0033685 A1 | 1/2019 | Fujimoto et al. |

FOREIGN PATENT DOCUMENTS

| | | |
|---|---|---|
| WO | 2017/022382 A1 | 2/2017 |
| WO | 2017/149933 A1 | 9/2017 |
| WO | 2017/221622 A1 | 12/2017 |

* cited by examiner

VIBRATION APPARATUS

CROSS REFERENCE TO RELATED APPLICATIONS

This application claims the benefit of priority to Japanese Patent Application No. 2018-123352 filed on Jun. 28, 2018 and is a Continuation Application of PCT Application No. PCT/JP2019/002545 filed on Jan. 25, 2019. The entire contents of each application are hereby incorporated herein by reference.

BACKGROUND OF THE INVENTION

1. Field of the Invention

The present invention relates to a vibration apparatus able to remove water droplets and the like by mechanical vibration.

2. Description of the Related Art

Imaging devices including cameras, which are used as monitoring apparatuses, have been required to constantly have clear fields of view. In particular, in cameras used outside, for example, for in-vehicle applications, various mechanisms to remove water droplets, such as raindrops, are proposed. International Publication No. 2017/221622 discloses a vibration apparatus that has a light transmissive portion arranged in front of a camera. The light transmissive portion is supported by a tubular main body. In this vibration apparatus, localized vibration is excited by providing a recess in the light transmissive portion or the tubular main body to move the water droplets to a vibration portion for atomization.

However, when the recess is provided in the light transmissive portion, there is a problem in that the optical axis of the light transmissive portion has a large displacement and an image captured by the camera or the like is likely to be displaced. In addition, when the light transmissive portion has a dome shape in order to receive light at a wide angle, it is difficult to manufacture the apparatus.

In contrast, when the tubular main body is driven, instead of the light transmissive portion, it is necessary to increase the size of the vibration apparatus in order to reliably excite the localized vibration. In addition, since the portion where the recess is provided is thin, the durability may be reduced.

Furthermore, when a (0,0) mode having a large amplitude in a central portion, which is described in International Publication No. 2017/221622, is used, the amplitude is decreased as the distance from the central portion is increased. Accordingly, there is a problem in that it is necessary to increase the driving voltage in the atomization of the water droplets to reduce the efficiency.

SUMMARY OF THE INVENTION

Preferred embodiments of the present invention provide vibration apparatuses that are each able to efficiently remove water droplets and the like.

In a vibration apparatus according to a preferred embodiment of the present invention, the vibration apparatus includes a vibrating body that has a tubular shape and that includes a first opening end portion, a second opening end portion, and an outside surface and an inside surface with which the first opening end portion is connected to the second opening end portion; a light transmissive body connected to the second opening end portion of the vibrating body; and a piezoelectric vibrator provided in the vibrating body to vibrate a connection body of the light transmissive body and the vibrating body. The vibrating body includes a flange portion extending from the outside surface of the vibrating body toward an outside. The vibration apparatus further includes a driving circuit that is electrically connected to the piezoelectric vibrator, that vibrates the connection body of the light transmissive body and the vibrating body in a vibration mode of light transmissive body vibration or a vibration mode of flange portion vibration, and that alternately switches between the vibration mode of the light transmissive body vibration and the vibration mode of the flange portion vibration.

In a vibration apparatus according to a preferred embodiment of the present invention, the vibration apparatus includes a vibrating body that has a tubular shape and that includes a first opening end portion, a second opening end portion, and an outside surface and an inside surface with which the first opening end portion is connected to the second opening end portion; a light transmissive body connected to the second opening end portion of the vibrating body; and a piezoelectric vibrator provided in the vibrating body to vibrate a connection body of the light transmissive body and the vibrating body. The vibrating body includes a flange portion extending from the outside surface of the vibrating body toward an outside. The vibration apparatus further includes a driving circuit that is electrically connected to the piezoelectric vibrator, that vibrates the connection body of the light transmissive body and the vibrating body in a vibration mode mainly using light transmissive body vibration or a vibration mode mainly using flange portion vibration, and that alternately switches between the vibration mode mainly using the light transmissive body vibration and the vibration mode mainly using the flange portion vibration. Provided that a resonant frequency of the light transmissive body vibration is denoted by f1 and a resonant frequency of the flange portion vibration is denoted by f2, a vibration frequency in the vibration mode mainly using the light transmissive body vibration is a frequency within a frequency range including f1 and a vibration frequency in the vibration mode mainly using the flange portion vibration is a frequency within a frequency range including f2.

In a vibration apparatus according to a preferred embodiment of the present invention, the vibration apparatus includes a vibrating body that has a tubular shape and that includes a first opening end portion and a second opening end portion; a light transmissive body connected to the second opening end portion of the vibrating body; and a piezoelectric vibrator that vibrates a connection body of the light transmissive body and the vibrating body. The vibrating body includes a flange portion extending toward an outside of the second opening end portion to which the light transmissive body is connected. The vibration apparatus further includes a driving circuit that is electrically connected to the piezoelectric vibrator, that vibrates a connecting portion of the light transmissive body and the vibrating body in a vibration mode of light transmissive body vibration or a vibration mode of flange portion vibration, and that alternately switches between the vibration mode of the light transmissive body vibration and the vibration mode of the flange portion vibration.

In a vibration apparatus according to a preferred embodiment of the present invention, the vibration apparatus includes a vibrating body that has a tubular shape and that includes a first opening end portion and a second opening end portion; a light transmissive body connected to the second opening end portion of the vibrating body; and a piezoelectric vibrator that vibrates a connection body of the light transmissive body and the vibrating body. The vibrating body includes a flange portion extending toward an outside of the second opening end portion to which the light transmissive body is connected. The vibration apparatus further includes a driving circuit that is electrically connected to the piezoelectric vibrator, that vibrates a connecting portion of the light transmissive body and the vibrating body in a vibration mode of light transmissive body vibration or a vibration mode of flange portion vibration, and that alternately switches between the vibration mode of the light transmissive body vibration and the vibration mode of the flange portion vibration. An amplitude of the flange portion is larger than an amplitude of the light transmissive body owing to the vibration mode of the flange portion vibration.

According to preferred embodiments of the present invention, vibration apparatuses are provided that are each able to efficiently remove water droplets and the like.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will herein be explained by describing examples of preferred embodiments of the present invention with reference to the drawing.

The preferred embodiments described in this description are only examples and partial replacement or combination of components in different preferred embodiments is available.

Figure 1:
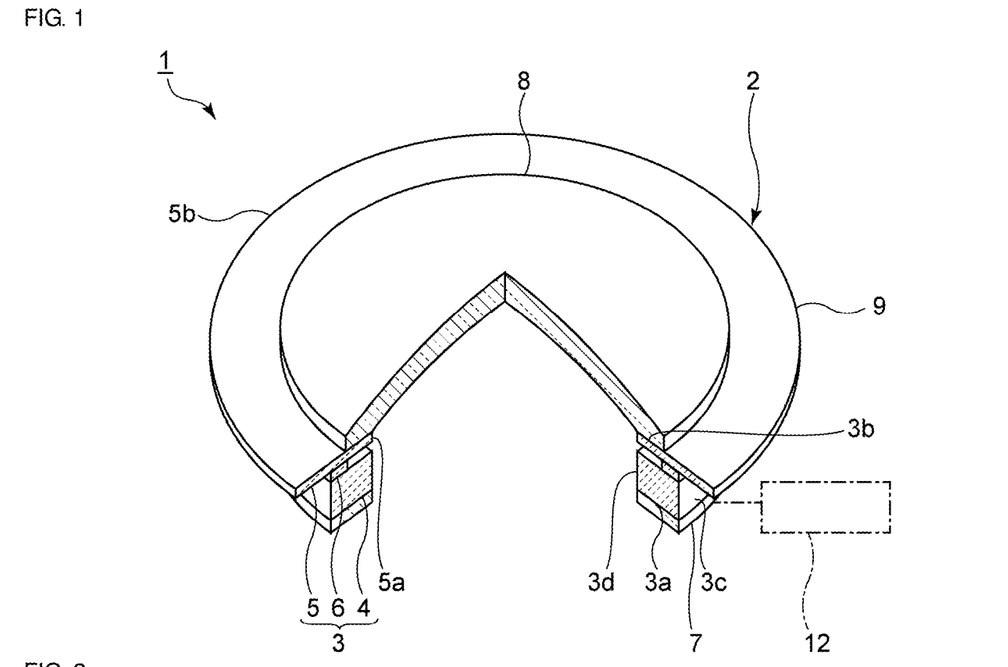
FIG. 1 is a partial cutaway perspective view of a vibration apparatus according to a first preferred embodiment of the present invention.

FIG. 1 is a partial cutaway perspective view of a vibration apparatus according to a first preferred embodiment of the present invention.

A vibration apparatus 1 shown in FIG. 1 is a vibration apparatus that moves water droplets and foreign objects by vibration or atomizes the water droplets and the like to remove the water droplets and the foreign objects from the field of view of an imaging element. The vibration apparatus 1 includes a vibration element 2 including a tubular vibrating body 3, a light transmissive body 8 to cover a cavity portion of the vibration element 2, and a driving circuit 12 electrically connected to the vibration element 2.

Figure 2:
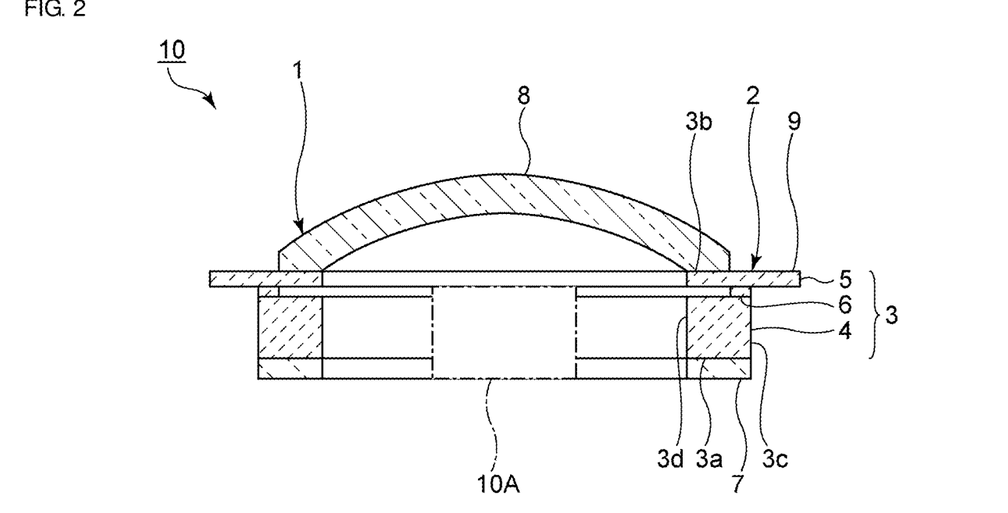
FIG. 2 is an elevational cross-sectional view of an imaging device including the vibration apparatus according to the first preferred embodiment of the present invention.

FIG. 2 is an elevational cross-sectional view of an imaging device including the vibration apparatus according to the first preferred embodiment of the present invention. The driving circuit may be omitted in perspective views and cross-sectional views other than FIG. 1.

An imaging element 10A shown by an alternate long and short dash line is located in an internal space surrounded by the vibrating body 3 and the light transmissive body 8. Accordingly, an imaging device 10 is provided, which defines and functions as an optical detection element according to a preferred embodiment of the present invention. The imaging device 10 includes the vibration apparatus 1 and the imaging element 10A. The imaging element 10A may be, for example, a complementary metal oxide semiconductor (CMOS), a charge coupled device (CCD), a bolometer, a thermopile, and the like, which receive light of any wavelength from a visible region to a far infrared region. The imaging device 10 may be, for example, a camera, a radar, a light detection and ranging (LIDAR) device, and the like.

An optical detection element other than the imaging element 10A, which optically detects energy lines, may be located in the internal space. The energy lines to be detected may be, for example, active energy lines including electromagnetic waves and infrared rays. A detection area of the optical detection element is included in a light transmissive body portion described below. In the imaging device 10 shown in FIG. 2, the field of view of the imaging element 10A is included in the light transmissive body 8. The light transmissivity in this description refers to light transmissivity in which at least energy lines and light of the wavelength detected by the optical detection element are transmitted.

The vibration apparatus 1 is described below.

The vibration element 2 includes the vibrating body 3 and a piezoelectric vibrator 7. The vibrating body 3 includes a first opening end portion 3a, a second opening end portion 3b, and an outside surface 3c and an inside surface 3d with which the first opening end portion 3a is connected to the second opening end portion 3b. In this description, the direction connecting the first opening end portion 3a of the vibrating body 3 to the second opening end portion 3b thereof is defined as an axial direction and a direction orthogonal or substantially orthogonal to the axial direction is defined as a radial direction.

The vibrating body 3 includes a tubular first vibrating body portion 4, a frame-shaped second vibrating body portion 5, and a frame-shaped connecting portion 6 with which the first vibrating body portion 4 is connected to the second vibrating body portion 5. The first vibrating body portion 4 includes the first opening end portion 3a of the vibrating body 3. The second vibrating body portion 5 includes the second opening end portion 3b of the vibrating body 3. The second vibrating body portion 5 and the connecting portion 6 have shapes corresponding to the first vibrating body portion 4, and the vibrating body 3 defines one tubular body. More specifically, the first vibrating body portion 4 has a cylindrical shape, the second vibrating body portion 5 has a ring shape, and the connecting portion 6 has a ring shape. The vibrating body 3 has a tubular shape in which the cylindrical first vibrating body portion 4, the ring-shaped connecting portion 6, and the ring-shaped second vibrating body portion 5 are located with the respective central axes positioned on the same or substantially the same concentric axis.

Here, in this description, an outer periphery and an inner periphery refer to the outer periphery and the inner periphery in a plan view unless otherwise specified. In a plan view, the outer periphery of the connecting portion 6 is overlapped with the outer periphery of the first vibrating body portion 4, and the inner periphery of the connecting portion 6 is positioned outside the inner peripheries of the first vibrating body portion 4 and the second vibrating body portion 5. Provided that the distance between the outside side face and the inner side face in the radial direction of each portion of the vibrating body 3 is defined as the wall thickness of the portion, the wall thickness of the connecting portion 6 is smaller than the wall thickness of the first vibrating body portion 4. In the vibrating body 3, the inner diameter of the connecting portion 6 is greater than the inner diameters of the other portions.

The outside surface 3c of the vibrating body 3 is provided by connecting the respective outside surfaces of the first vibrating body portion 4, the connecting portion 6, and the second vibrating body portion 5. Similarly, the inside surface 3d of the vibrating body 3 is provided by connecting the respective inside surfaces of the first vibrating body portion 4, the connecting portion 6, and the second vibrating body portion 5. In the present preferred embodiment, the inside surface 3d includes a stepped portion in the connecting portion 6. In contrast, the outside surface 3c does not include a stepped portion.

The vibrating body 3 includes a flange portion 9 extending from the outside surface 3c of the vibrating body 3 toward the outside in the radial direction. In the present preferred embodiment, the flange portion 9 is provided for the second vibrating body portion 5. The flange portion 9 extends toward the outside of the second opening end portion 3b. In the present preferred embodiment, the thickness of the second vibrating body portion 5 is the same as or similar to the thickness of the flange portion 9 in the axial direction described above. Accordingly, the flange portion 9 provided in the second vibrating body portion 5 is a portion that projects toward the outside over the outer periphery of the connecting portion 6 directly connected to the second vibrating body portion 5.

The first vibrating body portion 4 may have a substantially cylindrical shape or a prism shape, for example. Each of the connecting portion 6 and the second vibrating body portion 5 may have a frame shape other than the ring shape. Preferably, the first vibrating body portion 4, the second vibrating body portion 5, and the connecting portion 6 have similar shapes or substantially similar shapes in a plan view. Alternatively, the vibrating body 3 may include only the tubular first vibrating body portion 4. The outside surface 3c and the inside surface 3d of the vibrating body 3 may include stepped portions or may not have the stepped portions.

In the vibration element 2, the piezoelectric vibrator 7 is provided in the first opening end portion 3a of the vibrating body 3. The piezoelectric vibrator 7 includes a ring-shaped piezoelectric body. The piezoelectric body is preferably made of, for example, appropriate piezoelectric ceramics, such as $Pb(Zr, Ti)O_3$ or $(K, Na)NbO_3$, or appropriate piezoelectric single crystal, such as $LiTaO_3$ or $LiNbO_3$. An electrode is provided on each of one main surface and the other main surface of the piezoelectric body.

In the present preferred embodiment, one ring-shaped piezoelectric vibrator 7 is provided in the vibrating body 3. The shape of the piezoelectric vibrator 7 and the number of the piezoelectric vibrators 7 are not limited to those described above. For example, multiple piezoelectric vibrators may be located along a direction around the rotation axis, which is the center of the vibrating body 3, in a plan view. The piezoelectric body in the piezoelectric vibrator may have, for example, a rectangular or substantially rectangular plate shape.

As shown in FIG. 1, the dome-shaped light transmissive body 8 is connected to the second opening end portion 3b of the vibrating body 3. The light transmissive body 8 covers the cavity portion of the second vibrating body portion 5 of the vibrating body 3. Although the light transmissive body 8 has a dome shape, the light transmissive body 8 may have a flat or substantially flat plate shape, for example. The light transmissive body 8 is made of a light transmissive material. For example, light transmissive plastic, glass, or light transmissive ceramics may preferably be used as the light transmissive material. The piezoelectric vibrator 7 vibrates a connection body of the light transmissive body 8 and the vibrating body 3.

As described above, in the present preferred embodiment, the flange portion 9 is provided for the second vibrating body portion 5. The flange portion 9 may be provided for the first vibrating body portion 4 or the connecting portion 6. Alternatively, the portion where the flange portion 9 is provided on the outside surface 3c of the vibrating body 3 may include a portion corresponding to the first vibrating body portion 4 and the connecting portion 6 and may include a portion corresponding to the connecting portion 6 and the second vibrating body portion 5. When the flange portion 9 is thicker than the connecting portion 6 in the axial direction, the portion where the flange portion 9 is provided on the outside surface 3c of the vibrating body 3 may include a portion corresponding to the first vibrating body portion 4, the connecting portion 6, and the second vibrating body portion 5. Preferably, the flange portion 9 is located at the light transmissive body 8 side with respect to the position of the center in the axial direction of the vibrating body 3, for example.

The driving circuit 12 is electrically connected to the vibration element 2. More specifically, the driving circuit 12 is electrically connected to the piezoelectric vibrator 7. The driving circuit 12 vibrates the connection body of the light transmissive body 8 and the vibrating body 3 with the piezoelectric vibrator 7 by a vibration mode of light transmissive body vibration or a vibration mode of flange portion vibration, which are described below, and alternately switches between the vibration mode of the light transmissive body vibration and the vibration mode of the flange portion vibration. The vibration mode of the light transmissive body vibration is the mode of vibration in which the amplitude of the light transmissive body is larger than that of the flange portion. The vibration mode of the flange portion vibration is the mode of vibration in which the amplitude of the flange portion is larger than that of the light transmissive body. The vibration mode of the light transmissive body vibration is preferably, for example, the vibration mode in which a node of the vibration is not positioned inside the outer periphery in a plan view in the light transmissive body and a central portion of the light transmissive body has the maximum or substantially maximum amplitude. The vibration mode of the flange portion vibration is preferably, for example, the vibration mode in which the outer periphery has the maximum or substantially maximum amplitude in a plan view of the flange portion. The vibration mode of the light transmissive body vibration and the vibration mode of the flange portion vibration may be hereinafter simply referred to as the light transmissive body vibration and the flange portion vibration, respectively.

In the present preferred embodiment, the vibrating body 3 includes the second vibrating body portion 5 including the flange portion 9 and the vibration apparatus 1 includes the driving circuit 12, which alternately switches between the vibration mode of the light transmissive body vibration and the vibration mode of the flange portion vibration. Accordingly, the water droplets and the like are able to be efficiently removed, as described below.

Figure 3:
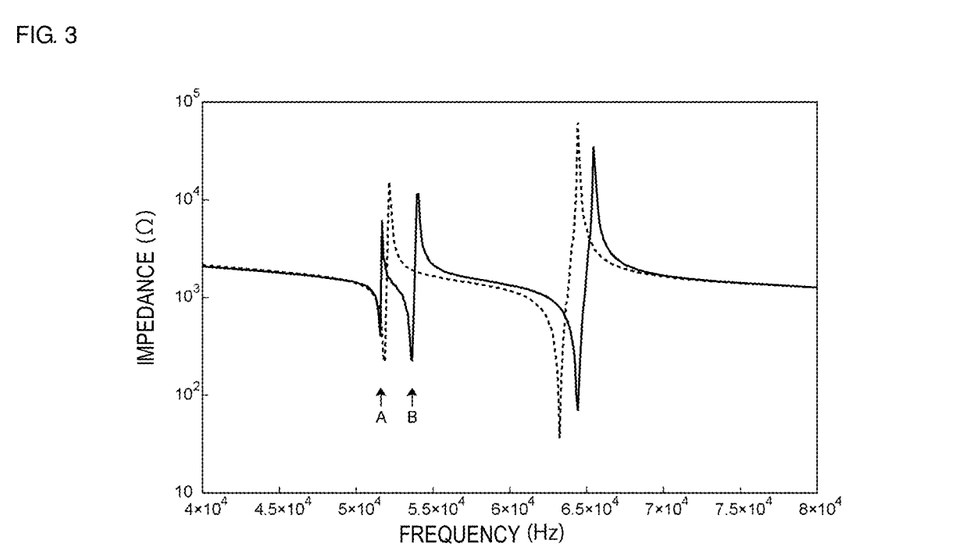
FIG. 3 is a graph showing examples of resonant frequencies in a vibration mode of light transmissive body vibration and a vibration mode of flange portion vibration.
Figure 4:
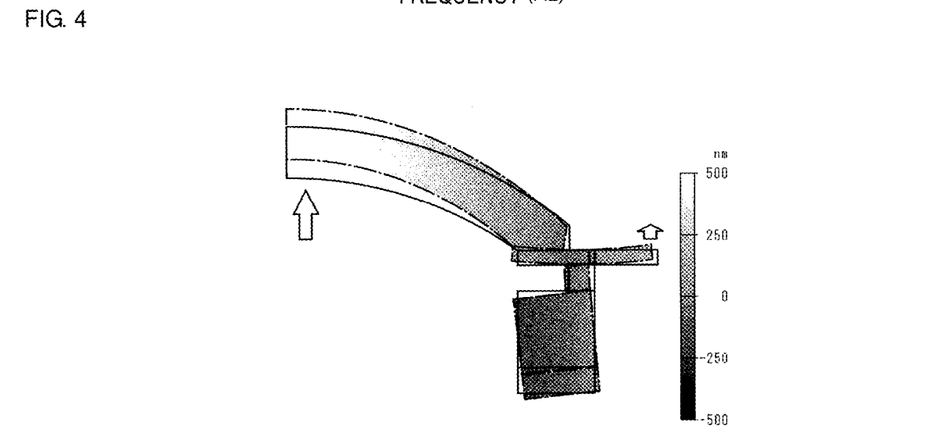
FIG. 4 is a cross-sectional view showing the vibration mode of the light transmissive body vibration.
Figure 5:
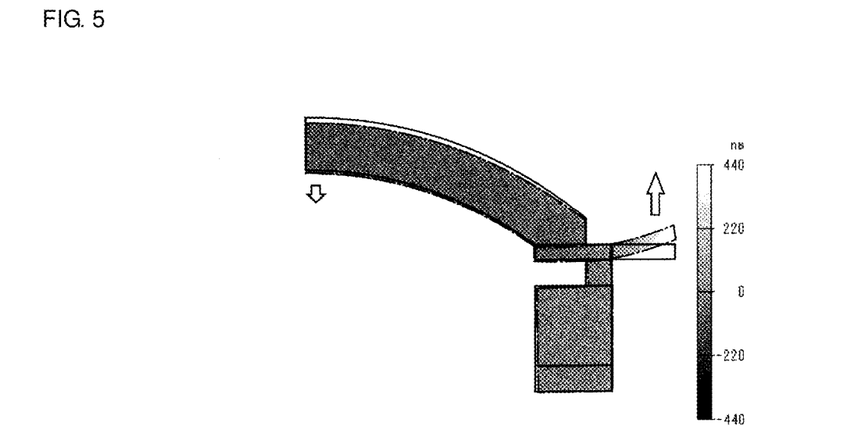
FIG. 5 is a cross-sectional view showing the vibration mode of the flange portion vibration.
Figure 6:
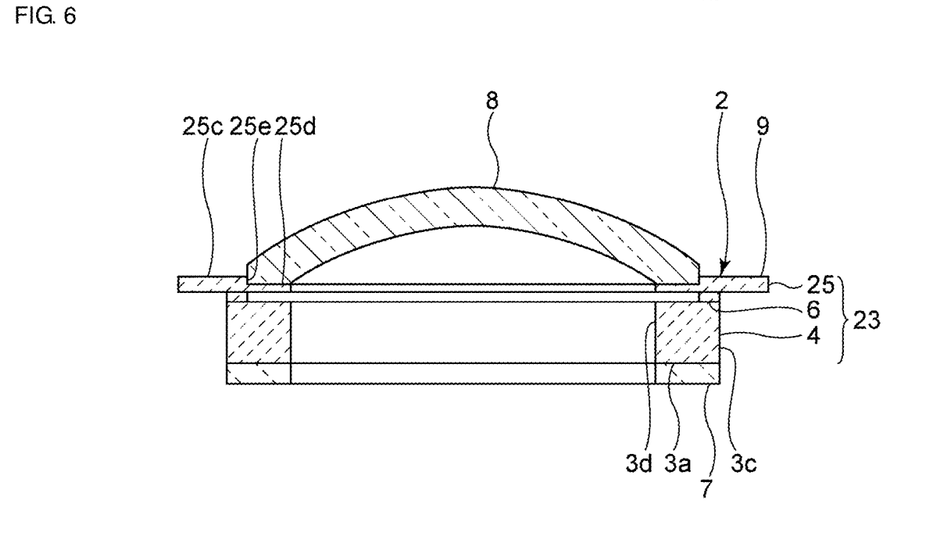
FIG. 6 is an elevational cross-sectional view of a vibration apparatus according to a first modification of the first preferred embodiment of the present invention.
Figure 7:
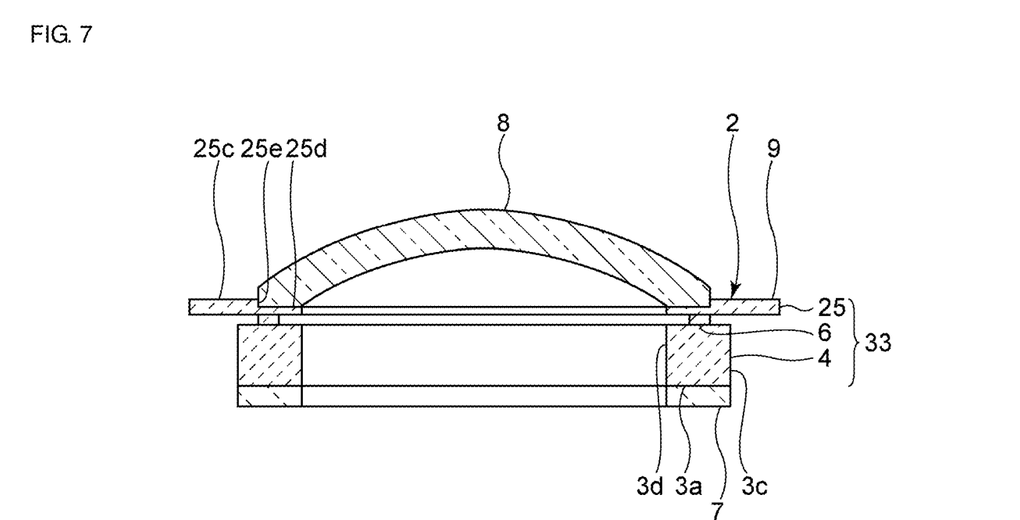
FIG. 7 is an elevational cross-sectional view of a vibration apparatus according to a second modification of the first preferred embodiment of the present invention.

FIG. 3 is a graph showing examples of resonant frequencies in the vibration mode of the light transmissive body vibration and the vibration mode of the flange portion vibration. FIG. 4 is a cross-sectional view showing the vibration mode of the light transmissive body vibration. FIG. 5 is a cross-sectional view showing the vibration mode of the flange portion vibration. Referring to FIG. 3, a solid line shows a result of the present preferred embodiment and a broken line shows a result of a comparative example. The comparative example differs from the present preferred embodiment in that the vibrating body does not include the flange portion. FIG. 4 and FIG. 5 show a portion corresponding to half of the cross-section of the vibration apparatus shown in FIG. 2. Solid lines show the original states of the vibration apparatus and alternate long and short dash lines show states in which the vibration apparatus is vibrating.

Referring to FIG. 3, an arrow A shows the resonant frequency in the vibration mode of the light transmissive body vibration in the present preferred embodiment and an arrow B shows the resonant frequency in the vibration mode of the flange portion vibration in the present preferred embodiment. The vibration mode of the light transmissive body vibration is the vibration mode in which the node of the vibration is not positioned inside the outer periphery in the light transmissive body 8 and the central portion of the light transmissive body 8 has the maximum or substantially maximum amplitude, as shown in FIG. 4. The amplitude of the flange portion 9 is small in the vibration mode of the light transmissive body vibration. The vibration mode of the flange portion vibration is the vibration mode in which the outer periphery of the flange portion 9 has the maximum or substantially maximum amplitude, as shown in FIG. 5. The amplitude of the light transmissive body 8 is small in the vibration mode of the flange portion vibration. In the vibration mode of the flange portion vibration, the node of the vibration is positioned in a portion on the inside surface 3d, which is closest to the position at which the flange portion 9 of the vibrating body 3 is fixed.

Provided that the dimension along the radial direction of the flange portion 9 is the length, the resonant frequencies in the vibration mode of the light transmissive body vibration and the vibration mode of the flange portion vibration are able to be adjusted by, for example, adjusting the length of the flange portion 9 and the thickness in the axial direction of the flange portion 9. For example, the state is available in which, although the light transmissive body vibration is the main vibration mode, the flange portion vibration is also slightly mixed, as shown in FIG. 4. Alternatively, the state is available in which, although the flange portion vibration is the main vibration mode, the light transmissive body vibration is also slightly mixed, as shown in FIG. 5.

Since the vibrating body does not include the flange portion in the comparative example, the vibration mode of the flange portion vibration does not occur in the comparative example, as shown in FIG. 3.

In the present preferred embodiment and the comparative example, the water droplets and the like adhering to the neighborhood of the center of the light transmissive body are able to be atomized and removed by vibrating the connection body of the light transmissive body and the vibrating body by the vibration mode of the light transmissive body vibration. In addition, the water droplets and the like move to an antinode of the vibration. Accordingly, the water droplets and the like that are not positioned adjacent to or in a vicinity of the center of the light transmissive body are able to be moved to the center at which the antinode of the vibration is positioned for atomization. In the vibration mode of the light transmissive body vibration, the node of the vibration is positioned adjacent to or in a vicinity of the portion where the light transmissive body is connected to the vibrating body. Accordingly, when only the vibration mode of the light transmissive body vibration is provided, as in the comparative example, the water droplets and the like adjacent to or in a vicinity of the node of the vibration are not able to be moved and atomized and, thus, the field of view of the imaging element may not be sufficiently ensured. In addition, driving voltage is increased to move and atomize the water droplets and the like adjacent to or in a vicinity of the outer periphery of the light transmissive body.

In contrast, in the present preferred embodiment shown in FIG. 1, the second vibrating body portion 5 includes the flange portion 9 and the driving circuit 12 alternately switches between the vibration mode of the light transmissive body vibration and the vibration mode of the flange portion vibration. The amplitude of the flange portion 9 of the vibrating body 3 is larger than that of the light transmissive body 8 owing to the vibration mode of the flange portion vibration. The water droplets and the like positioned adjacent to or in a vicinity of the portion where the light transmissive body 8 is connected to the second vibrating body portion 5 of the vibrating body 3 and adjacent to or in a vicinity of the outer periphery of the light transmissive body 8 are able to be easily moved to the flange portion 9 with the vibration mode of the flange portion vibration. The water droplets and the like positioned adjacent to or in a vicinity of the outer periphery of the light transmissive body 8 are able to be removed and blocking of the field of view of the imaging element 10A is able to be significantly reduced or prevented as described above. In addition, the water droplets and the like are able to be reliably removed by atomizing the water droplets and the like moved to the outer periphery of the flange portion 9. In the light transmissive body 8, the water droplets and the like positioned at portions other than the neighborhood of the outer periphery are able to be easily moved to the neighborhood of the center of the light transmissive body 8 using the vibration mode of the light transmissive body vibration for atomization. Accordingly, the water droplets and the like are able to be reliably and efficiently removed, without increasing the driving voltage, by switching the vibration mode as described above.

In addition, since the vibrating body 3 includes the flange portion 9 in the present preferred embodiment, the state is available in which the vibration mode of the light transmissive body vibration is provided as the main vibration mode and the vibration mode of the flange portion vibration is slightly mixed. Accordingly, the water droplets and the like positioned adjacent to or in a vicinity of the outer periphery of the light transmissive body 8 are able to be moved to the flange portion 9 side. Switching to the vibration mode of the flange portion vibration at this time enables the water droplets and the like to be more easily moved to the outer periphery of the flange portion 9 for atomization. Therefore, the water droplets and the like are able to be efficiently removed through cooperation of the vibration mode of the light transmissive body vibration and the vibration mode of the flange portion vibration as described above.

The resonant frequency in the vibration mode of the light transmissive body vibration is denoted by f1 and the resonant frequency in the vibration mode of the flange portion vibration is denoted by f2. The vibration frequency in the vibration mode mainly using the light transmissive body vibration is preferably, for example, a frequency within a frequency range including f1. The vibration frequency in the vibration mode of the flange portion vibration is preferably, for example, a frequency within a frequency range including f2. Accordingly, the water droplets and the like are able to be efficiently removed through cooperation of the vibration mode of the light transmissive body vibration and the vibration mode of the flange portion vibration. The vibration frequency in the vibration mode mainly using the light transmissive body vibration is preferably, for example, a frequency within a range from not lower than about 30 kHz and not higher than about 200 kHz. In excitation of the vibration in the vibration mode mainly using the flange portion vibration, a frequency within a range from not lower than about 30 kHz and not higher than about 200 kHz is preferably used, for example.

In the present preferred embodiment, the light transmissive body 8 is connected to the outermost portion of the vibrating body 3 in the axial direction. The position of the portion where the second vibrating body portion 5 of the vibrating body 3 is connected to the light transmissive body 8 is the same or substantially the same as the position of the flange portion 9 in the axial direction. Accordingly, the distance between the connecting portion and the flange portion 9 is able to be decreased, compared with that in a case in which the position of the connecting portion is different from the position of the flange portion 9 in the axial direction. Therefore, the water droplets and the like are preferably moved from the connecting portion and the neighborhood of the outer periphery of the light transmissive body 8 to the flange portion 9 using the vibration mode of the flange portion vibration, for example.

The position of the light transmissive body 8 is not limited to that described above and the light transmissive body 8 may be connected to a portion other than the outermost portion in the axial direction of the vibrating body 3. For example, in a first modification of the first preferred embodiment shown in FIG. 6, a surface at the light transmissive body 8 side of a second vibrating body portion 25 includes a stepped portion **25*e* extending in the axial direction and a first surface 25*c* and a second surface 25*d* that are connected to each other with the stepped portion 25*e*. The first surface 25*c* is positioned at the outer side in the radial direction and the second surface 25*d* is positioned at the inner side in the radial direction. The first surface 25*c* is positioned at the outermost side of a vibrating body 23 in the axial direction and the second surface 25*d* is positioned at the inner side of the first surface 25*c*. The light transmissive body 8 is connected to the second surface 25*d***. In addition, the water droplets and the like are able to be reliably and efficiently removed, as in the first preferred embodiment.

The second vibrating body portion 25 is preferably connected to the light transmissive body 8 with no gap provided between the stepped portion **25*e* and the light transmissive body 8**, for example. This enables the water droplets and the like to be more reliably removed.

As described above, the flange portion 9 of the present preferred embodiment shown in FIG. 2 is the portion projected from the outer periphery of the connecting portion 6 of the vibrating body 3 toward the outside in a plan view. Accordingly, when the length of the flange portion 9 is fixed, the distance between the outer periphery of the flange portion 9 and the portion where the second vibrating body portion 5 is connected to the light transmissive body 8 is decreased as the outer diameter of the connecting portion 6 is decreased. This enables the water droplets and the like to be efficiently moved from the connecting portion and the neighborhood of the outer periphery of the light transmissive body 8 to the outer periphery of the flange portion 9 by the vibration mode of the flange portion vibration.

Although the connecting portion 6 is overlapped with the outer periphery of the first vibrating body portion 4 in a plan view in the present preferred embodiment, the positional relationship between the connecting portion 6 and the outer periphery of the first vibrating body portion 4 is not limited to this. In a second modification of the first preferred embodiment shown in FIG. 7, the outer periphery of the connecting portion 6 of a vibrating body 33 is positioned at the inner side of the outer periphery of the first vibrating body portion 4. When the length of the flange portion 9 is fixed, the outer periphery of the flange portion 9 is positioned toward the inner side as the outer periphery of the connecting portion 6 is positioned toward the inner side. This enables the distance between the outer periphery of the flange portion 9 and the portion where the light transmissive body 8 is connected to the vibrating body 33 to be decreased. In a plan view, at least a portion of the connecting portion 6 is preferably overlapped with the light transmissive body 8, for example. As in the present modification, in a plan view, the outer periphery of the connecting portion 6 is more preferably overlapped with the light transmissive body 8, for example. In a plan view, the outer periphery of the connecting portion 6 is much more preferably positioned toward the inner side of the outer periphery of the light transmissive body 8, for example. This enables the distance between the outer periphery of the flange portion 9 and the connecting portion to be further decreased. Accordingly, the water droplets and the like are able to be more efficiently and more rapidly removed from the connecting portion and the neighborhood of the outer periphery of the light transmissive body 8 to the outer periphery of the flange portion 9.

In addition, in the present modification, the distance between the outer periphery of the flange portion 9 and the connecting portion is able to be decreased without decreasing the wall thicknesses of the first vibrating body portion 4 and the connecting portion 6 and increasing the outer diameter of the second vibrating body portion 5. Accordingly, the water droplets and the like are able to be more efficiently removed without reducing the strength and increasing the size.

The second vibrating body portion 25 of the present modification has the same or similar features as in the first modification. In a plan view, the outer periphery of the connecting portion 6 is overlapped with the stepped portion **25*e* and the connecting portion 6 is overlapped with the second face 25*d***.

Provided that the resonant frequency in the vibration mode of the light transmissive body vibration is denoted by f1 and the resonant frequency in the vibration mode of the flange portion vibration is denoted by f2, as described above, the frequency difference between the resonant frequency f1 in the vibration mode of the light transmissive body vibration and the resonant frequency f2 in the vibration mode of the flange portion vibration is represented by (f1−f2). A normalized frequency difference resulting from normalization of the frequency difference (f1−f2) with the resonant frequency f1 in the vibration mode of the light transmissive body vibration is represented by {(f1−f2)/f1}×100(%).

The resonant frequency f2 in the vibration mode of the flange portion vibration is able to be adjusted by the length of the flange portion 9 shown in FIG. 2. Accordingly, the normalized frequency difference is able to be adjusted by the length of the flange portion 9. Since the resonant frequency f2 in the vibration mode of the flange portion vibration is increased as the length of the flange portion 9 is decreased, the normalized frequency difference has a lower value as the length of the flange portion 9 is decreased. In contrast, since the resonant frequency f2 in the vibration mode of the flange portion vibration is decreased as the length of the flange portion 9 is increased, the normalized frequency difference has a higher value as the length of the flange portion 9 is increased.

The relationship between the normalized frequency difference and a coupling coefficient in the vibration mode of the light transmissive body vibration and in the vibration mode of the flange portion vibration and the relationship between the normalized frequency difference and displacement in the vibration mode of the light transmissive body vibration and in the vibration mode of the flange portion vibration are described below.

Figure 8:
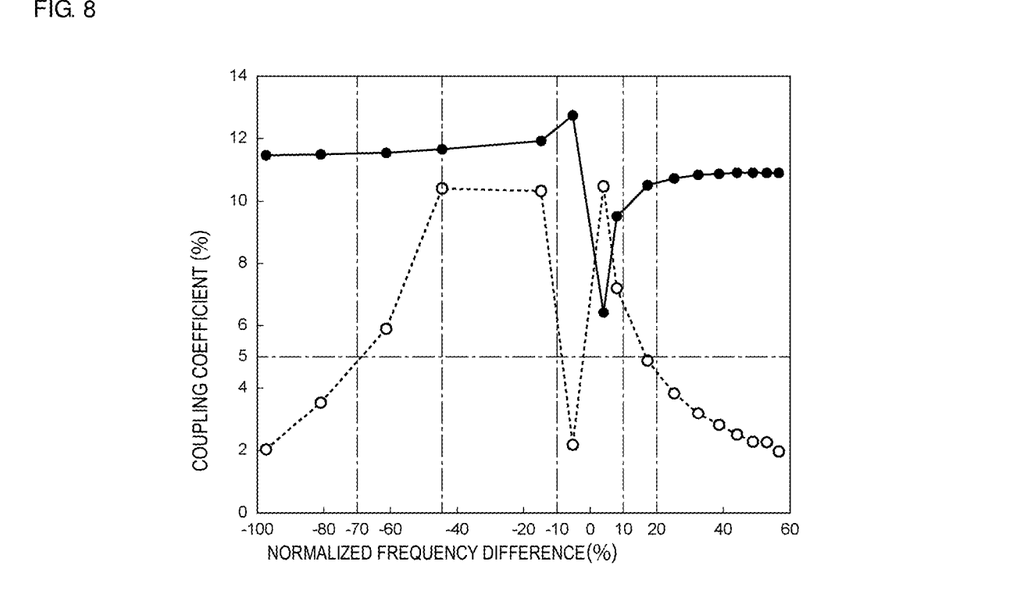
FIG. 8 is a graph showing the relationship between a normalized frequency difference and a coupling coefficient in the vibration mode of the light transmissive body vibration and the relationship between the normalized frequency difference and the coupling coefficient in the vibration mode of the flange portion vibration.
Figure 9:
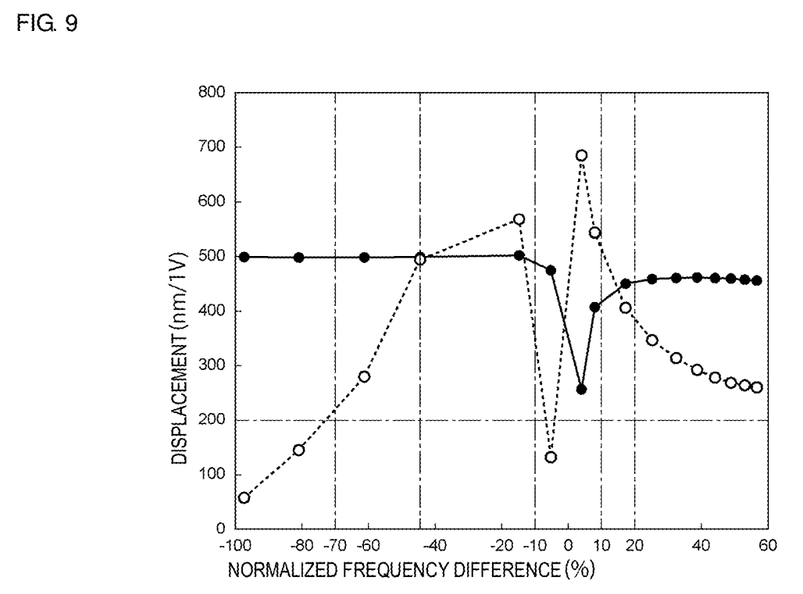
FIG. 9 is a graph showing the relationship between the normalized frequency difference and displacement in the vibration mode of the light transmissive body vibration and the relationship between the normalized frequency difference and the displacement in the vibration mode of the flange portion vibration.

FIG. 8 is a graph showing the relationship between the normalized frequency difference and the coupling coefficient in the vibration mode of the light transmissive body vibration and the relationship between the normalized frequency difference and the coupling coefficient in the vibration mode of the flange portion vibration. FIG. 9 is a graph showing the relationship between the normalized frequency difference and the displacement in the vibration mode of the light transmissive body vibration and the relationship between the normalized frequency difference and the displacement in the vibration mode of the flange portion vibration. Referring to FIG. 8 and FIG. 9, solid lines show results in the vibration mode of the light transmissive body vibration and broken lines show results in the vibration mode of the flange portion vibration. The displacement shown in FIG. 9 shows the magnitude of the displacement when voltage of 1 V is applied.

As shown in FIG. 8, the magnitude relationship between the coupling coefficient in the vibration mode of the light transmissive body vibration and the coupling coefficient in the vibration mode of the flange portion vibration is reversed near the normalized frequency difference of about 0%. Accordingly, the vibration state is unstable. The normalized frequency difference is preferably not higher than about −10% or not lower than about 10%, for example. At this normalized frequency difference, the vibration state is able to be stabilized.

As shown in FIG. 8 and FIG. 9, in the vibration mode of the flange portion vibration, both the coupling coefficient and the displacement are greatly decreased at normalized frequency differences not higher than about −45%. In particular, at normalized frequency differences smaller than about −70%, the coupling coefficient is about 5% or less and the displacement is about 200 nm/1V or less. The normalized frequency difference is preferably not smaller than about −70% and not larger than about −10%, and is more preferably not smaller than about −45% and not larger than about −10%, for example. At this normalized frequency difference, the coupling coefficient is preferably able to be increased and the displacement in the vibration mode of the flange portion vibration is preferably able to be increased while stabilizing the vibration state, for example.

If the flange portion 9 is too long, a variety of spurious modes may occur to make the excitation in the vibration mode of the light transmissive body vibration unstable. Accordingly, the normalized frequency difference is preferably not smaller than about 10% and not larger than about 20%, for example. At this normalized frequency difference, the vibration state is able to be further stabilized.

As shown in FIG. 8 and FIG. 9, in the vibration mode of the light transmissive body vibration, the coupling coefficient is high and the displacement is large in the range excluding the range in which the normalized frequency difference is larger than about −10% and smaller than about 10%. Here, the absolute value of the difference between the coupling coefficient in the vibration mode of the light transmissive body vibration and the coupling coefficient in the vibration mode of the flange portion vibration is preferably not larger than about 2%, for example. Therefore, the coupling coefficient is able to be increased and the displacement is able to be increased in both the vibration mode of the light transmissive body vibration and the vibration mode of the flange portion vibration. Accordingly, the connection body of the light transmissive body 8 and the vibrating body 3 is preferably able to be vibrated in both the vibration mode of the light transmissive body vibration and the vibration mode of the flange portion vibration, for example, to more reliably and efficiently remove the water droplets and the like.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A vibration apparatus comprising:
   a vibrating body that has a tubular shape and includes a first opening end portion, a second opening end portion, and an outside surface and an inside surface with which the first opening end portion is connected to the second opening end portion;
   a light transmissive body connected to the second opening end portion of the vibrating body; and
   a piezoelectric vibrator provided in the vibrating body to vibrate a connection body of the light transmissive body and the vibrating body; wherein
   the vibrating body includes a flange portion extending from the outside surface of the vibrating body toward an outside; and
   the vibration apparatus further includes a driving circuit that is electrically connected to the piezoelectric vibrator, that vibrates the connection body of the light transmissive body and the vibrating body in a vibration mode of light transmissive body vibration or a vibration mode of flange portion vibration, and that alternately switches between the vibration mode of the light transmissive body vibration and the vibration mode of the flange portion vibration.

2. A vibration apparatus comprising:
a vibrating body that has a tubular shape and includes a first opening end portion, a second opening end portion, and an outside surface and an inside surface with which the first opening end portion is connected to the second opening end portion;
a light transmissive body connected to the second opening end portion of the vibrating body; and
a piezoelectric vibrator provided in the vibrating body to vibrate a connection body of the light transmissive body and the vibrating body; wherein
the vibrating body includes a flange portion extending from the outside surface of the vibrating body toward an outside; and
the vibration apparatus further includes:
a driving circuit that is electrically connected to the piezoelectric vibrator, that vibrates the connection body of the light transmissive body and the vibrating body in a vibration mode mainly using light transmissive body vibration or a vibration mode mainly using flange portion vibration, and that alternately switches between the vibration mode mainly using the light transmissive body vibration and the vibration mode mainly using the flange portion vibration; wherein
a resonant frequency of the light transmissive body vibration is denoted by f1 and a resonant frequency of the flange portion vibration is denoted by f2, and a vibration frequency in the vibration mode mainly using the light transmissive body vibration is a frequency within a frequency range including f1 and a vibration frequency in the vibration mode mainly using the flange portion vibration is a frequency within a frequency range including f2.

3. The vibration apparatus according to claim 1, wherein the vibrating body includes a tubular first vibrating body portion, a frame-shaped second vibrating body portion, and a frame-shaped connecting portion with which the first vibrating body portion is connected to the second vibrating body portion; and
the first vibrating body portion includes the first opening end portion and the second vibrating body portion includes the second opening end portion.

4. The vibration apparatus according to claim 3, wherein the flange portion is provided in the second vibrating body portion.

5. The vibration apparatus according to claim 4, wherein, in a plan view, an outer periphery of the connecting portion is overlapped with the light transmissive body.

6. The vibration apparatus according to claim 4, wherein, in a plan view, an outer periphery of the connecting portion is overlapped with an outer periphery of the first vibrating body portion, and an inner periphery of the connecting portion is positioned outside inner peripheries of the first vibrating body portion and the second vibrating body portion.

7. The vibration apparatus according to claim 3, wherein the first vibrating body portion has a cylindrical shape, the second vibrating body portion has a ring shape, and the connecting portion has a ring shape.

8. The vibration apparatus according to claim 1, wherein the vibration mode of the light transmissive body vibration is a vibration mode in which a node of the vibration is not positioned inside an outer periphery in a plan view in the light transmissive body and a central portion of the light transmissive body has a maximum or substantially maximum amplitude; and
the vibration mode of the flange portion vibration is a vibration mode in which an outer periphery has a maximum or substantially maximum amplitude in a plan view of the flange portion.

9. The vibration apparatus according to claim 8, wherein a resonant frequency in the vibration mode of the light transmissive body vibration is denoted by f1 and a resonant frequency in the vibration mode of the flange portion vibration is denoted by f2, and a normalized frequency difference $\{(f1-f2)/f1\}\times 100(\%)$ resulting from normalization of a frequency difference $(f1-f2)$ between the resonant frequency f1 in the vibration mode of the light transmissive body vibration and the resonant frequency f2 in the vibration mode of the flange portion vibration with the resonant frequency f1 in the vibration mode of the light transmissive body vibration is not smaller than about −70% and not larger than about −10%.

10. The vibration apparatus according to claim 8, wherein, a resonant frequency in the vibration mode of the light transmissive body vibration is denoted by f1 and a resonant frequency in the vibration mode of the flange portion vibration is denoted by f2, and a normalized frequency difference $\{(f1-f2)/f1\}\times 100(\%)$ resulting from normalization of a frequency difference $(f1-f2)$ between the resonant frequency f1 in the vibration mode of the light transmissive body vibration and the resonant frequency f2 in the vibration mode of the flange portion vibration with the resonant frequency f1 in the vibration mode of the light transmissive body vibration is not smaller than about 10% and not larger than about 20%.

11. The vibration apparatus according to claim 8, wherein an absolute value of a difference between a coupling coefficient in the vibration mode of the light transmissive body vibration and a coupling coefficient in the vibration mode of the flange portion vibration is not larger than about 2%.

12. The vibration apparatus according to claim 1, wherein the piezoelectric vibrator is provided in the first opening end portion of the vibrating body.

13. The vibration apparatus according to claim 1, wherein, a direction connecting the first opening end portion to the second opening end portion is defined as an axial direction, and the light transmissive body is connected to an outermost portion of the vibrating body in the axial direction.

14. A vibration apparatus comprising:
a vibrating body that has a tubular shape and includes a first opening end portion and a second opening end portion;
a light transmissive body connected to the second opening end portion of the vibrating body; and
a piezoelectric vibrator that vibrates a connection body of the light transmissive body and the vibrating body; wherein
the vibrating body includes a flange portion extending toward an outside of the second opening end portion to which the light transmissive body is connected; and
the vibration apparatus further includes a driving circuit that is electrically connected to the piezoelectric vibrator, that vibrates a connecting portion of the light transmissive body and the vibrating body in a vibration mode of light transmissive body vibration or a vibration mode of flange portion vibration, and that alternately switches between the vibration mode of the light transmissive body vibration and the vibration mode of the flange portion vibration.

15. A vibration apparatus comprising:
- a vibrating body that has a tubular shape and includes a first opening end portion and a second opening end portion;
- a light transmissive body connected to the second opening end portion of the vibrating body; and
- a piezoelectric vibrator that vibrates a connection body of the light transmissive body and the vibrating body; wherein
- the vibrating body includes a flange portion extending toward an outside of the second opening end portion to which the light transmissive body is connected;
- the vibration apparatus further includes a driving circuit that is electrically connected to the piezoelectric vibrator, that vibrates a connecting portion of the light transmissive body and the vibrating body in a vibration mode of light transmissive body vibration or a vibration mode of flange portion vibration, and that alternately switches between the vibration mode of the light transmissive body vibration and the vibration mode of the flange portion vibration; and
- an amplitude of the flange portion is larger than an amplitude of the light transmissive body owing to the vibration mode of the flange portion vibration.

16. The vibration apparatus according to claim 14, wherein, a direction connecting the first opening end portion to the second opening end portion is defined as an axial direction, and the flange portion is located at the light transmissive body side with respect to a position of a center in the axial direction of the vibrating body.

17. The vibration apparatus according to claim 14, wherein
- the vibration mode of the light transmissive body vibration is a vibration mode in which a node of the vibration is not positioned inside an outer periphery in a plan view in the light transmissive body and a central portion of the light transmissive body has a maximum or substantially maximum amplitude; and
- the vibration mode of the flange portion vibration is a vibration mode in which an outer periphery has a maximum or substantially maximum amplitude in a plan view of the flange portion.

18. An imaging device, comprising:
- an imaging element; and
- the vibration apparatus according to claim 1, wherein
- the imaging element is surrounded by the vibrating body and the light transmissive body.

19. The imaging device according to claim 18, wherein the imaging element is a complementary metal oxide semiconductor (CMOS), a charge coupled device (CCD), a bolometer, or a thermopile.

20. The imaging device according to claim 18, further comprising:
- an optical detection element; wherein
- a detection area of the optical detection element includes at least a portion of the light transmissive body.

* * * * *